US012622133B2

(12) United States Patent
Ushikubo et al.

(10) Patent No.: US 12,622,133 B2
(45) Date of Patent: May 5, 2026

(54) DISPLAY DEVICE AND METHOD FOR MANUFACTURING THEREOF

(71) Applicant: Magnolia White Corporation, Tokyo (JP)

(72) Inventors: Takahiro Ushikubo, Tokyo (JP); Hayata Aoki, Tokyo (JP); Jun Nitta, Tokyo (JP); Hiroumi Kinjo, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 373 days.

(21) Appl. No.: 18/357,232

(22) Filed: Jul. 24, 2023

(65) Prior Publication Data

US 2024/0040818 A1 Feb. 1, 2024

(30) Foreign Application Priority Data

Jul. 29, 2022 (JP) ................................. 2022-121820

(51) Int. Cl.
| | |
|---|---|
| *H10K 50/19* | (2023.01) |
| *H10K 50/15* | (2023.01) |
| *H10K 50/17* | (2023.01) |
| *H10K 50/18* | (2023.01) |
| *H10K 59/122* | (2023.01) |
| *H10K 71/00* | (2023.01) |

(52) U.S. Cl.
CPC .......... *H10K 50/19* (2023.02); *H10K 50/156* (2023.02); *H10K 50/171* (2023.02); *H10K 50/181* (2023.02); *H10K 59/122* (2023.02); *H10K 71/00* (2023.02)

(58) Field of Classification Search
CPC .... H10K 50/19; H10K 50/156; H10K 50/171; H10K 50/181; H10K 59/122; H10K 59/80523; H10K 71/00; H10K 2102/103
See application file for complete search history.

(56) References Cited

U.S. PATENT DOCUMENTS

| | | | | |
|---|---|---|---|---|
| 2016/0211480 A1* | 7/2016 | Hanari | ................. | H10K 50/814 |
| 2017/0125508 A1* | 5/2017 | Kim | .................... | H10K 50/824 |
| 2024/0057366 A1* | 2/2024 | Levermore | .......... | H10K 50/131 |

FOREIGN PATENT DOCUMENTS

JP 2008-243559 A 10/2008

* cited by examiner

*Primary Examiner* — Anne M Hines
*Assistant Examiner* — Jose M Diaz
(74) *Attorney, Agent, or Firm* — Michael Best & Friedrich LLP

(57) ABSTRACT

To provide a display device, in which deterioration in characteristics is small even when some of layers are exposed to a solvent or an atmosphere when photolithography is performed, and a method for manufacturing the display device. The display device having a pixel including a plurality of sub-pixels includes: a substrate; a lower electrode provided on an upper side of the substrate; an organic EL layer provided on the lower electrode and including an emission layer configured to emit a different color for each sub-pixel; and an upper electrode disposed on an upper side of the organic EL layer. An exposure protection layer having transparency and conductivity provided for each sub-pixel is formed between the organic EL layer and the upper electrode. No emission layer is formed between the exposure protection layer and the upper electrode.

4 Claims, 8 Drawing Sheets

| 52 | 54 | 56 | |
|---|---|---|---|
| UPPER ELECTRODE | | | ~44 |
| EXPOSURE PROTECTION LAYER | EXPOSURE PROTECTION LAYER | EXPOSURE PROTECTION LAYER | ~328 |
| EIL | EIL | EIL | ~414 |
| ETL | ETL | ETL | ~412 |
| SECOND HBL | SECOND HBL | SECOND HBL | ~912 |
| SECOND R-EML | SECOND G-EML | SECOND B-EML | ~910B |
| SECOND EBL | SECOND EBL | SECOND EBL | ~908 |
| SECOND R-HTL | SECOND G-HTL | SECOND B-HTL | ~906B |
| pCGL | pCGL | pCGL | ~904 |
| nCGL | nCGL | nCGL | ~902 |
| FIRST HBL | FIRST HBL | FIRST HBL | ~410 |
| FIRST R-EML | FIRST G-EML | FIRST B-EML | ~408B |
| FIRST EBL | FIRST EBL | FIRST EBL | ~406 |
| FIRST R-HTL | FIRST G-HTL | FIRST B-HTL | ~404B |
| FIRST HIL | FIRST HIL | FIRST HIL | ~402 |
| LOWER ELECTRODE | LOWER ELECTRODE | LOWER ELECTRODE | ~324 |

910G~ 910R~ 906G~ 906R~ 408G~ 408R~ 404G~ 404R~

326

326R, 328
324
300

500

326R, 328
324
300

500

324

300

500

326G, 328
324
300

FIG.6A
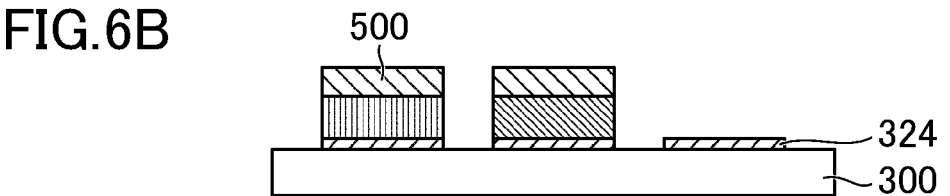
326G, 328
324
300
FIG.6B
500
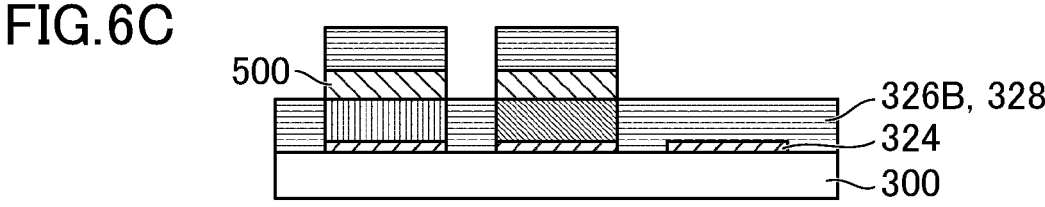
324
300
FIG.6C
500
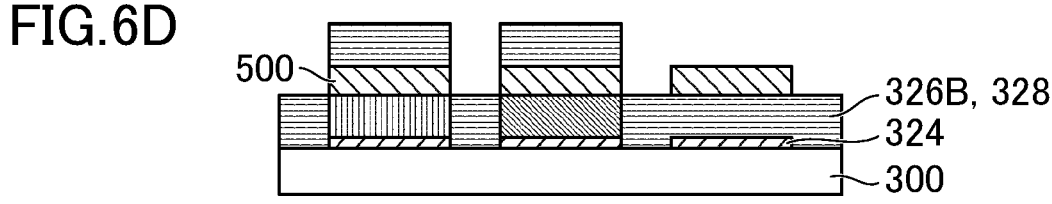
326B, 328
324
300
FIG.6D
500
326B, 328
324
300

DISPLAY DEVICE AND METHOD FOR MANUFACTURING THEREOF

CROSS-REFERENCE TO RELATED APPLICATION

The present application claims priority from Japanese application No. 2022-121820 filed on Jul. 29, 2022, the content of which is hereby incorporated by reference into this application.

BACKGROUND OF THE INVENTION

1. Field of the Invention

The present invention relates to a display device and a method for manufacturing thereof.

2. Description of the Related Art

In an organic electroluminescence (EL) display device, a thin film transistor (TFT), an organic light emitting diode (OLED), and the like are formed on a substrate. The OLED includes an organic layer between a pair of electrodes. The organic layer is formed by stacking, for example, a hole transport layer, an emission layer, and an electron transport layer. The emission layer may be formed of a material that emits white light, or may be formed of a material that emits a different color for each sub-pixel constituting a pixel.

When the emission layer is formed of a material that emits white light, there is a risk that current leakage occurs between adjacent sub-pixels (see JP 2008-243559 A), and there is a problem that luminance is lowered due to absorption of light by a color filter. Therefore, in recent years, the emission layer is often formed of a material that emits a different color for each sub-pixel.

In order to solve the above problem, JP 2008-243559 A discloses that a hole transport layer, which is formed on an upper portion of a partition wall and serves as a path through which a leakage current flows, is removed.

When an emission layer emitting a different color for each sub-pixel is formed, a leakage current generated between adjacent sub-pixels and absorption of light by a color filter can be reduced. However, since it is necessary to form an organic EL layer by photolithography, some of layers are exposed to an atmosphere or a solvent, and characteristics may deteriorate.

SUMMARY OF THE INVENTION

The present disclosure has been made in view of the above problem, and an object of the present disclosure is to provide a display device, in which deterioration in characteristics is small even when some of layers are exposed to a solvent or an atmosphere when photolithography is performed, and a method for manufacturing the display device.

In order to solve the above problem, a display device according to one aspect of the present disclosure is a display device having a pixel including a plurality of sub-pixels. The display device includes: a substrate; and a plurality of pixels provided on the substrate, each of the plurality of pixels including a plurality of sub-pixels. Each of the plurality of pixels includes: a lower electrode provided on an upper side of the substrate; an organic EL layer provided on the lower electrode and including an emission layer configured to emit a different color for each sub-pixel; and an upper electrode disposed on an upper side of the organic EL layer. An exposure protection layer having transparency and conductivity provided for each sub-pixel is formed between the organic EL layer and the upper electrode. No emission layer is formed between the exposure protection layer and the upper electrode.

A method for manufacturing a display device according to another aspect of the present disclosure includes steps of: forming a lower electrode on an upper side of a substrate; forming an organic EL layer on the lower electrode, the organic EL layer including an emission layer configured to emit a different color for each sub-pixel; forming an exposure protection layer having transparency and conductivity for each sub-pixel in contact with the organic EL layer; and forming an upper electrode on an upper side of the exposure protection layer. No emission layer is formed between the exposure protection layer and the upper electrode.

According to the invention, it is possible to provide a display device, in which deterioration in characteristics is small even when some of layers are exposed to a solvent or an atmosphere when photolithography is performed, and a method for manufacturing the display device.

BRIEF DESCRIPTION OF THE DRAWINGS

FIG. 6A to FIG. 6D are diagrams showing a method for manufacturing the organic EL display device.

DETAILED DESCRIPTION OF THE INVENTION

First Embodiment

Figure 1:
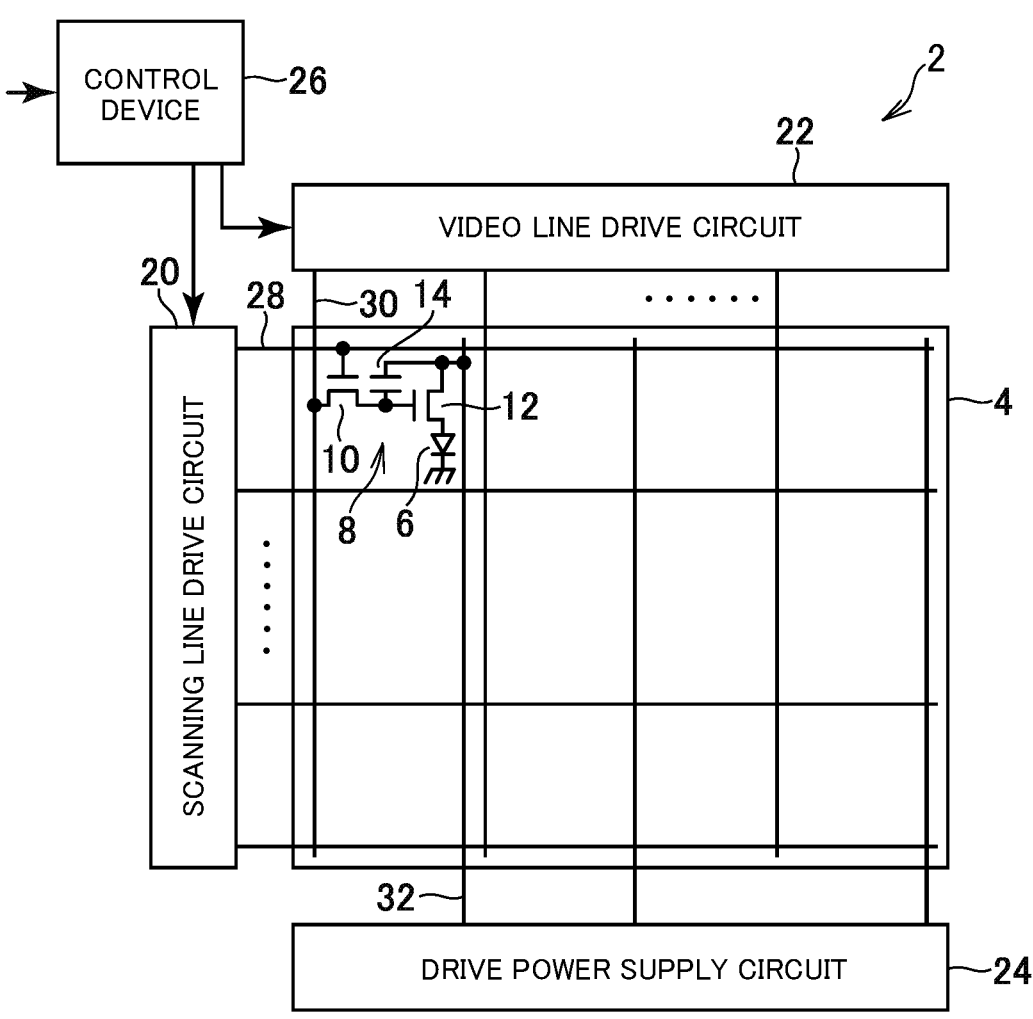
FIG. 1 is a schematic diagram showing a schematic configuration of an organic EL display device according to an embodiment.

Hereinafter, embodiments of the invention will be described with reference to the drawings.

In the drawings referred to in the following description, in order to make the description clearer, a width, a thickness, a shape, and the like of each unit may be schematically represented as compared with an actual aspect. The width, the thickness, the shape, and the like of each unit are merely examples and do not limit the interpretation of the invention. In the present specification and the drawings, the same elements as those described in preceding drawings are denoted by the same reference signs, and the detailed description may be omitted as appropriate.

FIG. 1 is a schematic diagram showing a schematic configuration of an organic EL display device 2 according to an embodiment. The organic EL display device 2 includes a pixel array unit 4 that displays an image and a drive unit that drives the pixel array unit 4. The organic EL display device 2 has a configuration in which a stacked structure of TFTs 10 and 12 and OLEDs 6 is formed on a substrate 300 (see FIG. 3). The schematic diagram shown in FIG. 1 is an example, and the present embodiment is not limited thereto.

In the pixel array unit 4, the OLEDs 6 and pixel circuits 8 are disposed in a matrix corresponding to pixels. The pixel circuit 8 includes a plurality of the TFTs 10 and 12 and a capacitor 14.

The drive unit includes a scanning line drive circuit 20, a video line drive circuit 22, a drive power supply circuit 24, and a control device 26, and drives the pixel circuit 8 to control light emission of the OLED 6.

The scanning line drive circuit 20 is connected to a scanning signal line 28 provided for each row of pixels (pixel row) in a horizontal direction. The scanning line drive circuit 20 sequentially selects the scanning signal line 28 according to a timing signal received from the control device 26, and applies a voltage for turning on the lighting TFTs 10 to the selected scanning signal line 28.

The video line drive circuit 22 is connected to a video signal line 30 provided for each column of pixels (pixel column) in a vertical direction. The video line drive circuit 22 receives a video signal from the control device 26, and outputs a voltage corresponding to a video signal of the selected pixel row to each video signal line 30 according to the selection of the scanning signal line 28 by the scanning line drive circuit 20. The voltage is applied to the capacitors 14 via the lighting TFTs 10 in the selected pixel row. The drive TFT 12 supplies a current corresponding to the applied voltage to the OLED 6, and thus the OLED 6 of the pixel corresponding to the selected scanning signal line 28 emits light.

The drive power supply circuit 24 is connected to a drive power supply line 32 provided for each pixel column, and supplies a current to the OLEDs 6 via the drive power supply line 32 and the drive TFTs 12 of the selected pixel row.

Here, a lower electrode 324 (see FIG. 3) of the OLED 6 is connected to the drive TFT 12. On the other hand, an upper electrode 44 (see FIGS. 2 and 3) of each OLED 6 is implemented by an electrode common to the OLEDs 6 of all the pixels. When the lower electrode 324 is implemented by an anode, a high potential is input, the upper electrode 44 is implemented by a cathode, and a low potential is input. When the lower electrode 324 is implemented by a cathode, a low potential is input, the upper electrode 44 is implemented by an anode, and a high potential is input.

Figure 2:
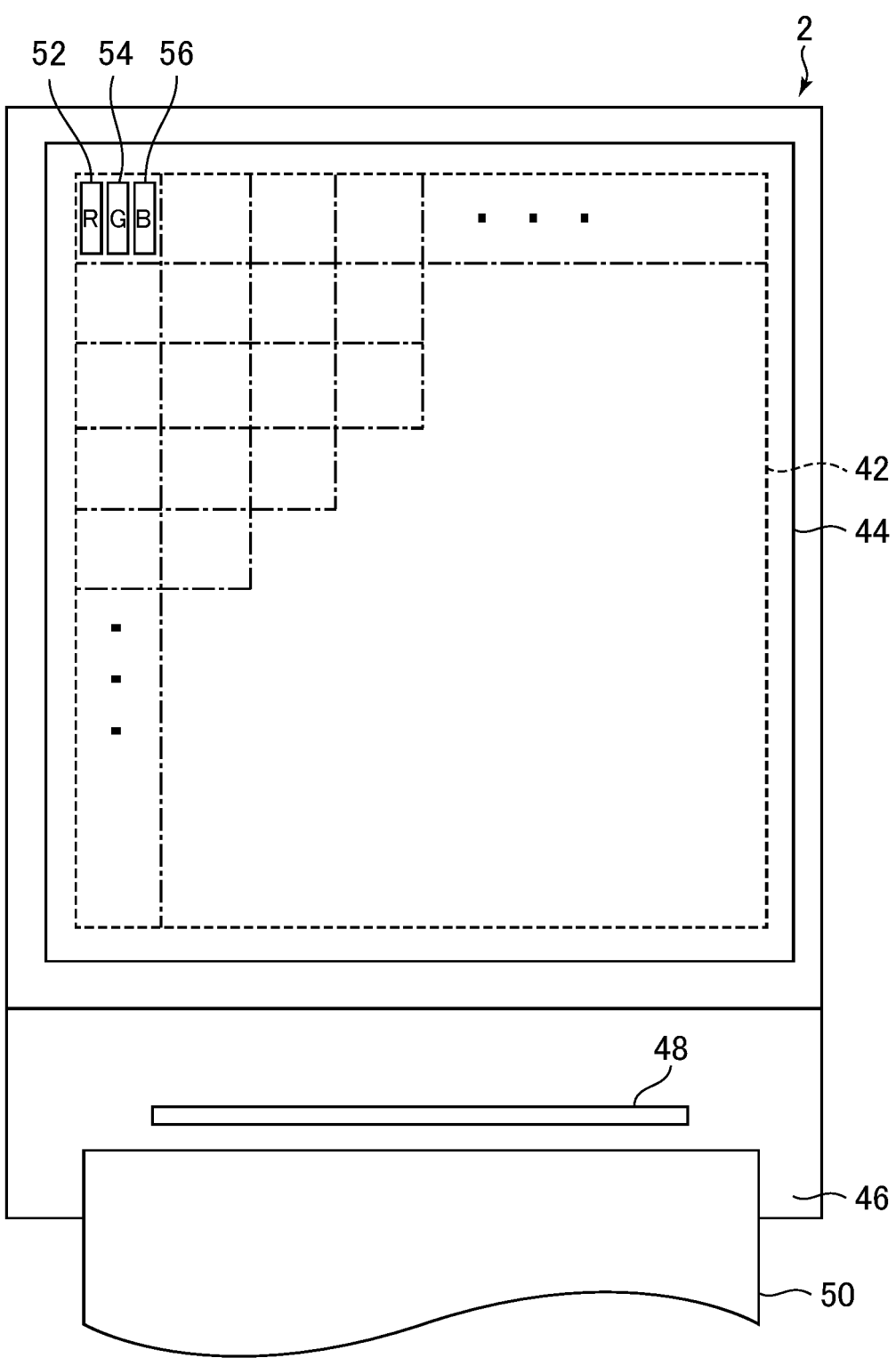
FIG. 2 is a schematic plan view showing an example of the organic EL display device according to the present embodiment.

FIG. 2 is a schematic plan view showing an example of the organic EL display device 2 shown in FIG. 1. The pixel array unit 4 shown in FIG. 1 is provided in a display region 42 of the organic EL display device 2, and the OLEDs 6 are arranged in the pixel array unit 4 as described above. As described above, the upper electrode 44 constituting the OLED 6 is formed in common to each pixel and covers the entire display region 42.

A component mounting region 46 is provided on one side of the rectangular organic EL display device 2, and wiring connected to the display region 42 is disposed. In the component mounting region 46, a driver integrated circuit (driver IC 48) constituting the drive unit is mounted, and a flexible printed circuit (FPC 50) is connected. The FPC 50 is connected to the control device 26 and the other circuits 20, 22, and 24, and an IC is mounted thereon.

Each pixel includes a plurality of sub-pixels. Specifically, for example, each pixel includes a first sub-pixel 52 that emits red light, a second sub-pixel 54 that emits green light, and a third sub-pixel 56 that emits blue light.

Figure 3:
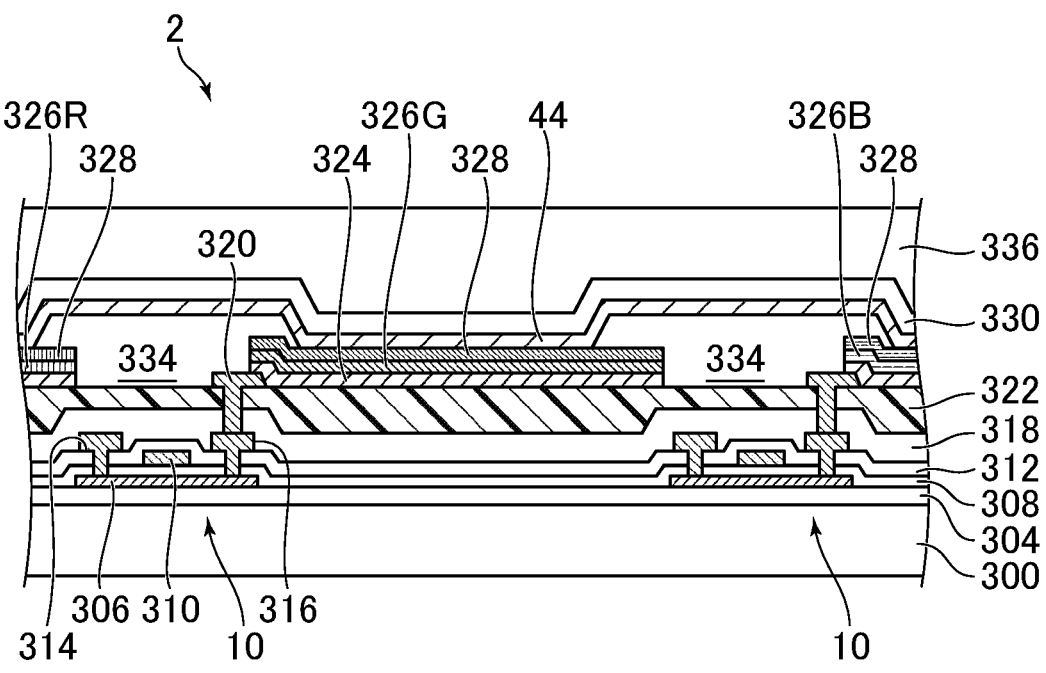
FIG. 3 is a diagram showing a cross section around a pixel.

FIG. 3 is a diagram showing a cross section around a pixel. In FIG. 3, hatching of some layers is omitted in order to facilitate viewing of a cross-sectional structure. In the following description, a stacking direction is an upward direction.

The substrate 300 is made of a flexible resin such as polyimide. An upper surface of the substrate 300 is covered with an undercoat layer 304. A semiconductor layer 306 is formed on the undercoat layer 304, and the semiconductor layer 306 is covered with a gate insulating film 308. A gate electrode 310 is formed on the gate insulating film 308, and the gate electrode 310 is covered with a passivation film 312. A drain electrode 314 and a source electrode 316 penetrate the gate insulating film 308 and the passivation film 312, and are connected to the semiconductor layer 306. The semiconductor layer 306, the gate electrode 310, the drain electrode 314, and the source electrode 316 constitute the lighting TFT 10. The lighting TFT 10 corresponds to each of a plurality of unit pixels. The undercoat layer 304, the gate insulating film 308, and the passivation film 312 are formed of an inorganic insulating material such as $SiO_2$ or SiN. The semiconductor layer 306 is implemented by a semiconductor such as low temperature poly-silicon (LTPS).

The drain electrode 314 and the source electrode 316 are covered with an interlayer insulating film 318, and the interlayer insulating film 318 is covered with a planarization film 322. The drain electrode 314 and the source electrode 316 are formed of a conductive material containing, for example, Al, Ag, Cu, Ni, Ti, or Mo. The interlayer insulating film 318 is formed of an inorganic insulating material such as $SiO_2$ or SiN. The planarization film 322 is formed of an organic insulating material such as an acrylic resin, and has a planar upper surface.

The lower electrode 324 is formed on the planarization film 322. The lower electrode 324 is connected to a connection electrode 320 which penetrates the planarization film 322 and the interlayer insulating film 318 and is connected to the source electrode 316. The lower electrode 324 individually corresponds to each of the plurality of unit pixels. In the present embodiment, the organic EL display device 2 is of a top emission type, and the lower electrode 324 is formed as a reflective electrode. The lower electrode 324 is formed of a conductive material containing, for example, Al, Ag, Cu, Ni, Ti, or Mo, or a conductive oxide such as ITO or IZO.

An organic EL layer 326 is provided on the lower electrode 324, and includes an emission layer that emits a different color for each sub-pixel. Specifically, the organic EL layer 326 is disposed on the lower electrode 324 provided for each sub-pixel. The organic EL layer 326 of each sub-pixel emits light of a specific color for each sub-pixel. A detailed layer configuration of the organic EL layer 326 will be described later.

An exposure protection layer 328 is provided for each sub-pixel between the organic EL layer 326 and the upper electrode 44, and has transparency and conductivity. Details of the exposure protection layer 328 will be described later.

A bank 334 is disposed between adjacent sub-pixels, and partitions the adjacent sub-pixels. Specifically, the bank 334 is disposed from an end portion of the exposure protection layer 328 disposed in one sub-pixel to an end portion of the exposure protection layer 328 adjacent to the one sub-pixel. An inner edge portion of the bank 334 is placed on a peripheral edge portion of the exposure protection layer 328, and the bank 334 has a forward tapered shape in which a width decreases from a bottom portion toward the upper side in a cross-sectional view. The bank 334 is formed of an organic insulating material such as an acrylic resin or a polyimide resin. Accordingly, the bank 334 partitions the adjacent sub-pixels. The bank 334 may be disposed on a lower side of the organic EL layer 326, and the organic EL layer 326 and the exposure protection layer 328 may ride on the end portions of the bank 334. The bank 334 is also called a rib.

The exposure protection layer 328 and the bank 334 are covered with the upper electrode 44. The upper electrode 44 is formed as a uniform film (so-called solid film) extending over the entire display region 42. The organic EL layer 326, and the lower electrode 324 and the upper electrode 44 sandwiching the organic EL layer 326 constitute an organic light emitting diode (OLED). One of the lower electrode 324 and the upper electrode 44 is an anode and the other is a cathode. Accordingly, the organic EL layer 326 emits light by a current flowing between the lower electrode 324 and the upper electrode 44. The emission layer is provided only inside the organic EL layer 326, and the organic EL display device 2 has no emission layer between the exposure protection layer 328 and the upper electrode 44.

The upper electrode 44 is sealed by being covered with a sealing film 330 (passivation film), and is blocked from moisture. The sealing film 330 is formed of an inorganic insulating material such as SiO$_2$ or SiN. The sealing film 330 is covered with a protection film 336. The protection film 336 is formed of an organic insulating material such as an acrylic resin, and secures mechanical resistance.

Figure 4:
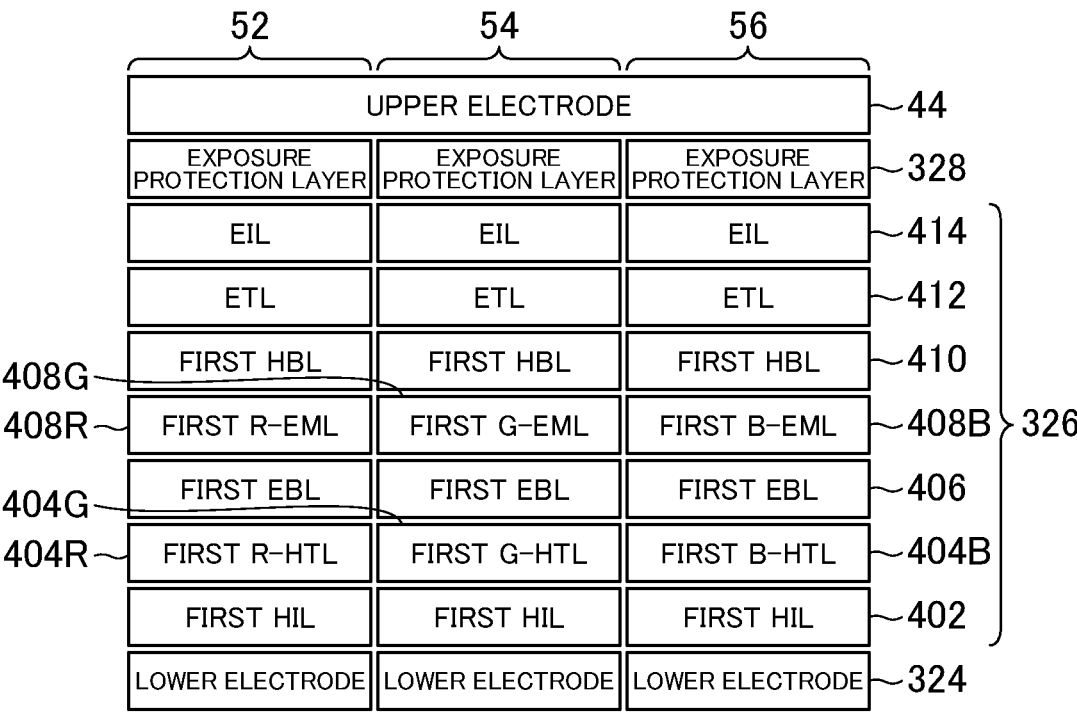
FIG. 4 is a diagram showing a layer configuration of an organic EL layer and an exposure protection layer according to a first embodiment.

Next, the organic EL layer 326 and the exposure protection layer 328 will be described in detail. FIG. 4 is a diagram showing a layer configuration of the organic EL layer 326 and the exposure protection layer 328 according to a first embodiment, and is a diagram schematically showing a layer configuration from the lower electrode 324 to the upper electrode 44. In the following description, a case will be described where the lower electrode 324 is an anode and the upper electrode 44 is a cathode.

The organic EL layer 326 includes a first hole injection layer 402, a first hole transport layer 404, a first electron blocking layer 406, a first emission layer 408, a first hole blocking layer 410, an electron transport layer 412, and an electron injection layer 414. In the drawing, the hole injection layer is referred to as HIL, the hole transport layer is referred to as HTL, the electron blocking layer is referred to as EBL, the emission layer is referred to as EML, the hole blocking layer is referred to as HBL, the electron transport layer is referred to as ETL, and the electron injection layer is referred to as EIL.

The first hole injection layer 402 (first HIL in the drawing) is disposed on the lower electrode 324 for each sub-pixel, and holes are supplied from the lower electrode 324.

The first hole transport layer 404 is disposed for each sub-pixel. Specifically, for example, a first hole transport layer 404R (first R-HTL in the drawing) for a sub-pixel that emits red light is disposed on the first sub-pixel 52. A first hole transport layer 404G (first G-HTL in the drawing) for a sub-pixel that emits green light is disposed on the second sub-pixel 54. A first hole transport layer 404B (first B-HTL in the drawing) for a sub-pixel that emits blue light is disposed on the third sub-pixel 56. Each first hole transport layer 404 is formed with an appropriately set film thickness and is formed of a material according to a color of light emitted by each sub-pixel.

The first electron blocking layer 406 (first EBL in the drawing) is disposed on the first hole transport layer 404, and prevents electrons penetrating the first emission layer 408 from reaching the first hole transport layer 404.

The first emission layer 408 is disposed on the first electron blocking layer 406, and emits red, green, or blue light. Specifically, the first emission layer 408 is individually formed on the first electron blocking layer 406 for each sub-pixel. For example, as described above, the pixel includes the first sub-pixel 52 that emits red light, the second sub-pixel 54 that emits green light, and the third sub-pixel that emits blue light. In this case, a first emission layer 408R (first R-EML in the drawing) of the first sub-pixel 52 is formed of a material emitting red light, a first emission layer 408G (first G-EML in the drawing) of the second sub-pixel 54 is formed of a material emitting green light, and a first emission layer 408B (first B-EML in the drawing) of the third sub-pixel 56 is formed of a material emitting blue light. The first emission layer 408 emits light by combining holes supplied from the lower electrode 324 and electrons supplied from the upper electrode 44.

The first hole blocking layer 410 (first HBL in the drawing) is disposed on the first emission layer 408, and prevents holes penetrating the first emission layer 408 from reaching the electron transport layer 412.

The electron transport layer 412 (ETL in the drawing) is disposed on the first hole blocking layer 410 for each sub-pixel, and electrons are supplied from the electron injection layer.

The electron injection layer 414 (EIL in the drawing) is disposed on the electron transport layer 412 for each sub-pixel, and electrons are supplied from the upper electrode via the exposure protection layer.

The exposure protection layer 328 is disposed on the electron injection layer 414. Specifically, the exposure protection layer 328 is provided on the electron injection layer 414 for each sub-pixel, and is formed of a material having transparency and conductivity. For example, the exposure protection layer 328 is formed of MgAg or a transparent conductive oxide (TCO). Examples of the transparent conductive oxide include indium tin oxide (ITO), SnO$_2$, and ZnO. The material of the exposure protection layer 328 may be appropriately selected. A material having high transmittance is preferable in order to extract the light emitted from the first emission layer 408 to the outside, and a material having low electric resistance that does not hinder movement of the electrons supplied from the upper electrode 44 to the electron injection layer 414 is preferable. The exposure protection layer 328 may be formed of the same material as the upper electrode 44, or may be formed of a different material. The exposure protection layer 328 reduces deterioration of the organic EL layer 326 due to a solvent during atmosphere exposure or photolithography as described later.

The upper electrode 44 is disposed on and in contact with the exposure protection layer 328. As described above, the upper electrode 44 is provided as a layer common to each sub-pixel. The upper electrode 44 may be formed of the same material as the exposure protection layer 328, or may be formed of a different material. Specifically, for example, the upper electrode 44 is formed of MgAg or a transparent conductive oxide (TCO). Examples of the transparent conductive oxide include indium tin oxide (ITO), SnO$_2$, and ZnO. The material of the upper electrode 44 may be appropriately selected. A material having high transmittance is preferable in order to extract the light emitted from the first emission layer 408 to the outside, and a material having low electric resistance that does not hinder the movement of the electrons supplied to the electron injection layer 414 is preferable.

Next, a method for manufacturing the organic EL display device 2 according to the first embodiment will be described with reference to FIGS. 5A to 7D. Since a method for forming layers below the lower electrode 324 formed on the substrate 300 is the same as a known technique, the method is omitted in FIGS. 5A to 7D.

Figure 5A:
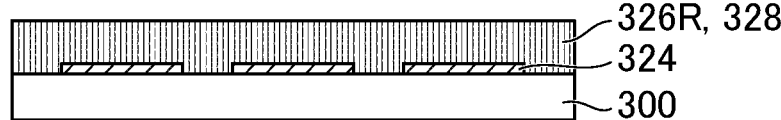
FIG. 5A to FIG. 5D are diagrams showing a method for manufacturing the organic EL display device.

First, layers (eight layers from the first hole injection layer 402 to the exposure protection layer 328 shown in FIG. 4) provided in the organic EL layer 326 and the exposure protection layer 328 of the first sub-pixel 52 are continuously formed on the entire surface of the substrate 300 on which the layers below the lower electrode 324 are formed (FIG. 5A). The first emission layer 408R provided in the organic EL layer 326 formed in this step contains a material that emits red light. Here, "continuously formed" means that after a layer is formed, the next layer is formed without being exposed to the atmosphere or the solvent.

Figure 5B:
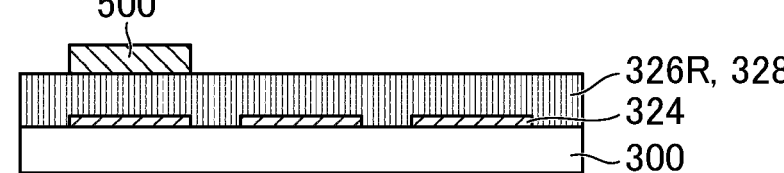

Next, a photo resist 500 is disposed in a region above the lower electrode 324 of the first sub-pixel 52 (FIG. 5B). In this step, for example, first, the photo resist 500 is applied to the entire surface of the material of the first emission layer 408 applied in FIG. 5A. Then, only a region above the lower electrode 324 of the first sub-pixel 52 is irradiated with ultraviolet ray using a photomask. Thereafter, the photo resist 500 shown in FIG. 5B is formed by cleaning, by the solvent, the photo resist 500 which is not cured by the ultraviolet ray.

Figure 5C:
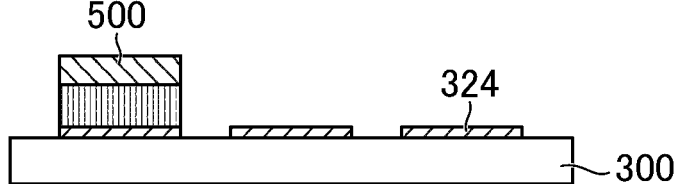

Next, etching is performed (FIG. 5C). Specifically, the organic EL layer 326 and the exposure protection layer 328 of the first sub-pixel 52 are removed by dry etching in all regions in which the photo resist 500 is not disposed in the step in FIG. 5B. By the etching, the organic EL layer 326 and the exposure protection layer 328 that are formed in the step in FIG. 5A remain only in a region below the photo resist 500 disposed in the step in FIG. 5B.

Figure 5D:
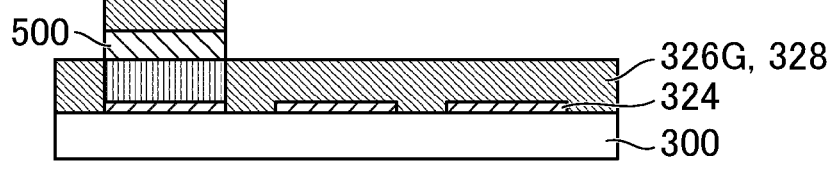

Next, layers (eight layers from the first hole injection layer 402 to the exposure protection layer 328) provided in the organic EL layer 326 and the exposure protection layer 328 of the second sub-pixel 54 shown in FIG. 4 are continuously formed on the entire surface (FIG. 5D). The first emission layer 408G provided in the organic EL layer 326 formed in this step contains a material that emits green light.

Next, the photo resist 500 is disposed in a region above the lower electrode 324 of the second sub-pixel 54 (FIG. 6A). The step in FIG. 6A is the same as the step in FIG. 5B except for a position where the photo resist 500 is disposed.

Next, etching is performed (FIG. 6B). Specifically, the organic EL layer 326 and the exposure protection layer 328 of the second sub-pixel 54 are removed by dry etching in all regions in which the photo resist 500 is not disposed in the step in FIG. 6A. By the etching, the organic EL layer 326 and the exposure protection layer 328 that are formed in the step in FIG. 5D remain only in a region below the photo resist 500 disposed in the step in FIG. 6A.

Next, layers (eight layers from the first hole injection layer 402 to the exposure protection layer 328) provided in the organic EL layer 326 and the exposure protection layer 328 of the third sub-pixel 56 shown in FIG. 4 are continuously formed on the entire surface (FIG. 6C). The first emission layer 408B provided in the organic EL layer 326 formed in this step contains a material that emits blue light.

Next, the photo resist 500 is disposed in a region above the lower electrode 324 of the third sub-pixel 56 (FIG. 6D). The step in FIG. 6D is the same as the step in FIG. 5B except for the position where the photo resist 500 is disposed.

Figure 7A:
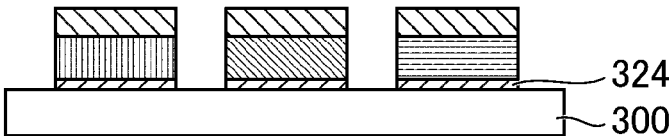
FIG. 7A to FIG. 7D are diagrams showing a method for manufacturing the organic EL display device.

Next, etching is performed (FIG. 7A). Specifically, the organic EL layer 326 and the exposure protection layer 328 of the third sub-pixel 56 are removed by dry etching in all regions in which the photo resist 500 is not disposed in the step in FIG. 6D. By the etching, the organic EL layer 326 and the exposure protection layer 328 that are formed in the step in FIG. 6C remain only in a region below the photo resist 500 disposed in the step in FIG. 6D.

Figure 7B:
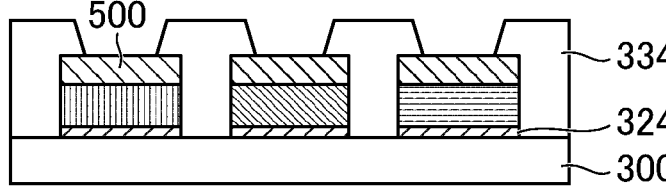

Next, the bank 334 that partitions adjacent sub-pixels is disposed between the adjacent sub-pixels (FIG. 7B). Specifically, for example, the bank 334 as shown in FIG. 7B is formed using a metal mask to deposit a material of the bank 334 from between the sub-pixels to end portions of the layers formed in FIGS. 5A to 7A. The bank 334 may be formed by photolithography without using the metal mask.

Figure 7C:
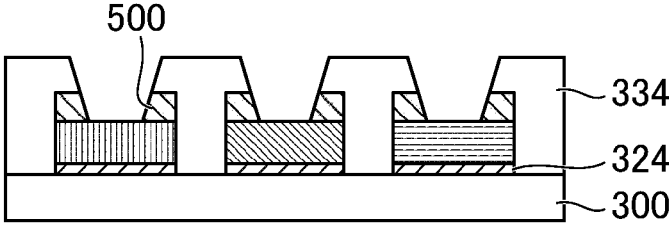

Next, a part of the photo resist 500 is removed (FIG. 7C). Specifically, for example, in the photo resist 500 disposed in each sub-pixel, a region not covered with the bank 334 is removed by etching. The region from which the photo resist 500 is removed is a region (light emitting region) from which light of each sub-pixel is extracted.

Figure 7D:
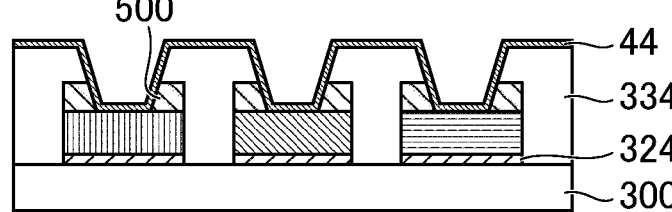

Next, the upper electrode 44 is formed (FIG. 7D). As described above, the upper electrode 44 may be formed of the same material as the exposure protection layer 328, or may be formed of a different material. Since the upper electrode 44 is formed as a layer common to each sub-pixel, the upper electrode 44 is formed not only on the light emitting region of each sub-pixel but also on the bank 334. Thereafter, the sealing film 330 and the protection film 336 (not shown) are formed on the upper electrode 44, thereby completing the organic EL display device 2.

As shown in FIG. 7D, the photo resist 500 remains below the bank 334. However, by adding a step of completely removing the photo resist 500 after the step in FIG. 7A, the organic EL display device 2 may be manufactured by a method in which the photo resist 500 does not remain.

As described above, in the steps of FIGS. 5B and 5C, an uppermost surface of the exposure protection layer 328 is exposed to the atmosphere or the solvent for the arrangement and etching of the photo resist 500. In the present embodiment, the exposure protection layer 328 is formed of MgAg or a transparent conductive oxide, and no emission layer is formed between the exposure protection layer 328 and the upper electrode 44. In general, as compared with the material of each layer provided in the organic EL layer 326, MgAg and the transparent conductive oxide deteriorate less due to exposure to the atmosphere or the solvent. Therefore, according to the present embodiment, by protecting the organic EL layer 326 with the exposure protection layer 328, it is possible to prevent the electron transport layer and the emission layer that are provided in the organic EL layer 326 from deteriorating due to exposure to the atmosphere or the solvent. Since the material of the exposure protection layer 328 is the same as that of the upper electrode 44 and a new material is not required, an increase in manufacturing cost can be prevented.

In the steps in FIGS. 6A, 6B, 6D, and 7A, as in the steps in FIGS. 5B and 5C, the upper surface of the exposure protection layer 328 is exposed to the atmosphere or the solvent for the arrangement and etching of the photo resist 500. Therefore, it is possible to prevent deterioration due to exposure of the electron transport layers and the emission layers of not only the first sub-pixel 52 but also the second sub-pixel 54 and the third sub-pixel 56 to the atmosphere or the solvent.

Second Embodiment

Figure 8:
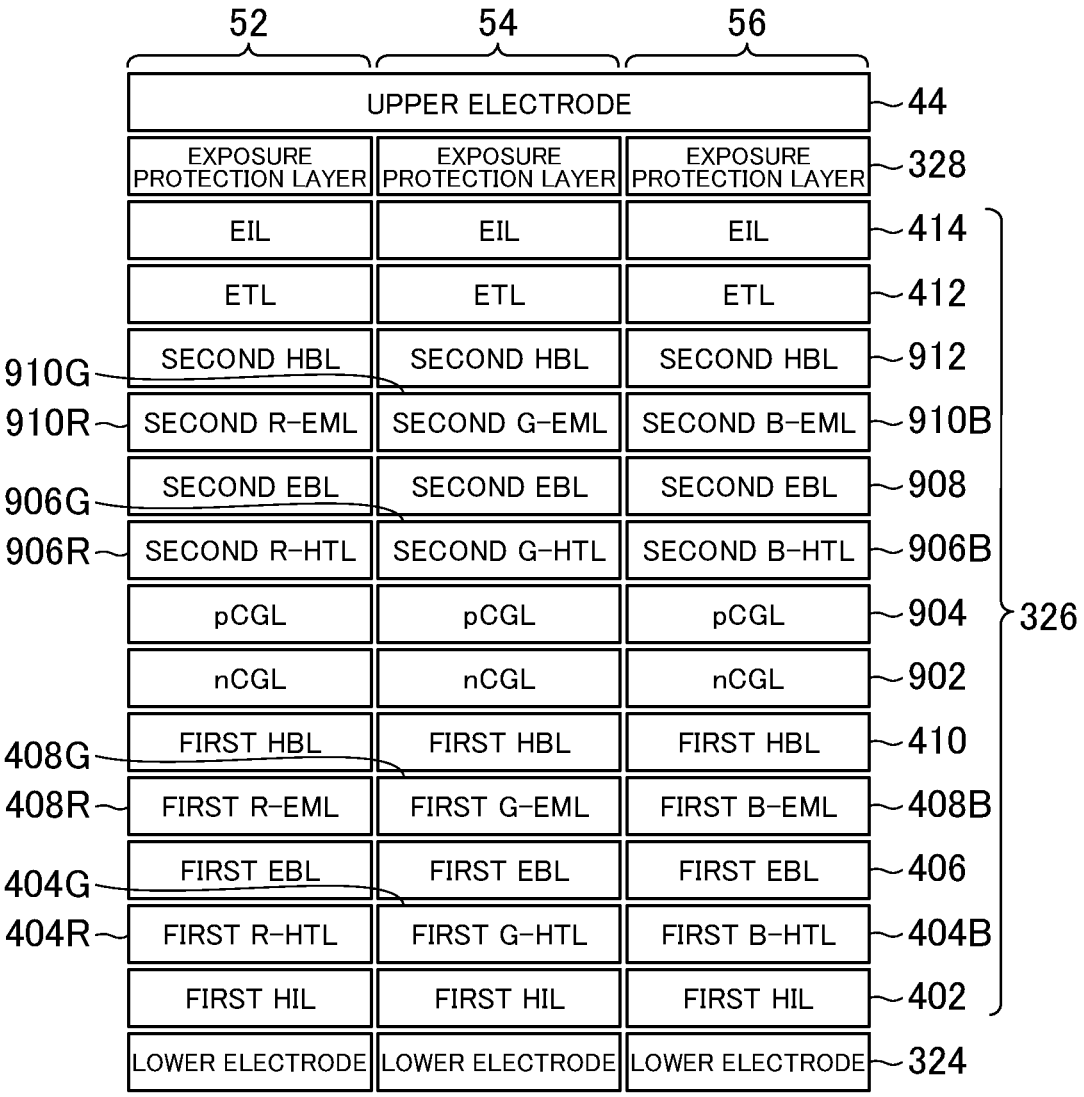
FIG. 8 is a diagram showing a layer configuration of an organic EL layer and an exposure protection layer according to a second embodiment.

Next, a second embodiment will be described. FIG. 8 is a diagram showing a layer configuration of the organic EL layer 326 and the exposure protection layer 328 according to the second embodiment, and is a diagram schematically showing a layer configuration from the lower electrode 324 to the upper electrode 44. The description of the same configuration as that of the first embodiment is omitted.

As shown in FIG. 8, in the second embodiment, the organic EL layer 326 includes at least two emission layers for each sub-pixel, and the organic EL display device 2 has a tandem structure. Specifically, the organic EL layer 326 includes the first hole injection layer 402, the first hole transport layer 404, the first electron blocking layer 406, the first emission layer 408, the first hole blocking layer 410, a charge generation layer, a second hole transport layer 906, a second electron blocking layer 908, a second emission layer 910, a second hole blocking layer 912, the electron transport layer 412, and the electron injection layer 414. Since a configuration from the first hole injection layer 402 to the first hole blocking layer 410 is the same as that of the first embodiment, the detailed description thereof will be omitted.

The charge generation layer is disposed on the first hole blocking layer 410. Specifically, the charge generation layer is disposed on the first hole blocking layer 410 for each sub-pixel, and includes an n-type charge generation layer 902 (nCGL) and a p-type charge generation layer 904 (pCGL). When a voltage is applied to the upper electrode 44 and the lower electrode 324, the nCGL 902 generates electrons and the pCGL 904 generates holes. The generated electrons are supplied to the first emission layer 408, and the generated holes are supplied to the second emission layer 910.

The second hole transport layer 906 is disposed on the charge generation layer. Specifically, for example, the second hole transport layer 906 is provided on the pCGL 904 for each sub-pixel. A second hole transport layer 906R (second R-HTL in the drawing) for a sub-pixel that emits red light is disposed on the first sub-pixel 52. A second hole transport layer 906G (second G-HTL in the drawing) for a sub-pixel that emits green light is disposed on the second sub-pixel 54. A second hole transport layer 906B (second B-HTL in the drawing) for a sub-pixel that emits blue light is disposed on the third sub-pixel 56. Each second hole transport layer 906 is formed with an appropriately set film thickness and is formed of a material according to a color of light emitted by each sub-pixel.

The second electron blocking layer 908 (second EBL in the drawing) is disposed on the second hole transport layer 906, and prevents electrons penetrating the second emission layer 910 from reaching the second hole transport layer 906.

The second emission layer 910 is disposed on the second electron blocking layer 908, and emits red, green, or blue light. Specifically, the second emission layer 910 is individually formed on the second electron blocking layer 908 for each sub-pixel. For example, as described above, the pixel includes the first sub-pixel 52 that emits red light, the second sub-pixel 54 that emits green light, and the third sub-pixel 56 that emits blue light. In this case, a second emission layer 910R (second R-EML in the drawing) of the first sub-pixel 52 is formed of a material emitting red light, a second emission layer 910G (second G-EML in the drawing) of the second sub-pixel 54 is formed of a material emitting green light, and a second emission layer 910B (second B-EML in the drawing) of the third sub-pixel 56 is formed of a material emitting blue light. The second emission layer 910 emits light by combining holes supplied from the charge generation layer and electrons supplied from the upper electrode 44.

The second hole blocking layer 912 (second HBL in the drawing) is disposed on the second emission layer 910, and prevents holes penetrating the second emission layer 910 from reaching the electron transport layer 412.

The electron transport layer 412 (ETL in the drawing) is disposed on the second hole blocking layer 912 for each sub-pixel, and electrons are supplied from the electron injection layer 414.

The electron injection layer 414 (EIL in the drawing) is disposed on the electron transport layer 412 for each sub-pixel, and electrons are supplied from the upper electrode 44 via the exposure protection layer 328.

The exposure protection layer 328 is disposed on the electron injection layer 414. Specifically, the exposure protection layer 328 is provided on the electron injection layer 414 for each sub-pixel, and is formed of a material having transparency and conductivity.

According to the second embodiment, each sub-pixel includes two emission layers, and each of the two emission layers emits light. Therefore, luminance can be improved as compared with the first embodiment.

In the second embodiment, in the step shown in FIG. 5A, each layer from the first hole injection layer 402 to the exposure protection layer 328 of the first sub-pixel 52 is formed. In the step shown in FIG. 5D, each layer from the first hole injection layer 402 to the exposure protection layer 328 of the second sub-pixel 54 is formed. In the step shown in FIG. 6C, each layer from the first hole injection layer 402 to the exposure protection layer 328 of the third sub-pixel 56 is formed. In the second embodiment, the exposure protection layer 328 is also formed of MgAg or a transparent conductive oxide, and no emission layer is formed between the exposure protection layer 328 and the upper electrode 44. Therefore, in the second embodiment, by protecting the organic EL layer 326 with the exposure protection layer 328, it is also possible to prevent the electron transport layer and the emission layer that are provided in the organic EL layer 326 from deteriorating due to exposure to the atmosphere or the solvent.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a substrate; and
   a plurality of pixels provided on the substrate, each of the plurality of pixels including a plurality of sub-pixels, wherein
   each of the plurality of pixels comprises:
      a lower electrode provided on an upper side of the substrate;
      an organic EL layer provided on the lower electrode and including an emission layer configured to emit a different color for each sub-pixel; and
      an upper electrode disposed on an upper side of the organic EL layer,
   the organic EL layer comprises
      a first hole injection layer disposed on the lower electrode,
      a first hole transport layer disposed on the first hole injection layer,
      a first electron blocking layer disposed on the first hole transport layer, a first emission layer disposed on the first electron blocking layer and configured to emit red, green, or blue light, a first hole blocking layer disposed on the first emission layer, a charge generation layer disposed on the first hole blocking layer, a second hole transport layer disposed on the charge generation layer, a second electron blocking layer disposed on the second hole transport layer, a second emission layer disposed on the second electron blocking layer and configured to emit red, green, or blue light, a second hole blocking layer disposed on the second emission layer, an electron transport layer disposed on the second hole blocking layer, and a second electron injection layer disposed on the electron transport layer, an exposure protection layer having transparency and conductivity provided for each sub-pixel is formed between the organic EL layer and the upper electrode, and no emission layer is formed between the exposure protection layer and the upper electrode.

2. The display device according to claim 1, wherein the organic EL layer has a tandem structure including at least two layers of the emission layer for each of the sub-pixels.

3. The display device according to claim 1, wherein the exposure protection layer contains the same material as the upper electrode.

4. The display device according to claim 1, further comprising:

a bank disposed between the adjacent sub-pixels and configured to partition the adjacent sub-pixels.

* * * * *